: US005502622A

United States Patent [19]
Cromwell

[11] Patent Number: 5,502,622
[45] Date of Patent: Mar. 26, 1996

[54] RETENTION CLIP TO MOUNT A HANDLE TO A CIRCUIT BOARD

[75] Inventor: S. Daniel Cromwell, Roseville, Calif.

[73] Assignee: Hewlett-Packard Company, Palo Alto, Calif.

[21] Appl. No.: 315,995

[22] Filed: Sep. 30, 1994

[51] Int. Cl.[6] .................................................. H05K 7/14
[52] U.S. Cl. ..................... 361/801; 361/796; 361/752; 174/17 R; 439/154; 439/327
[58] Field of Search ..................................... 361/752, 754, 361/759, 796, 798, 801, 802; 439/154–159, 374–377, 327–328, 345, 61; 174/17 R, 50, 265.5; 312/265.6, 265.4

[56] References Cited

U.S. PATENT DOCUMENTS

| | | | |
|---|---|---|---|
| 4,632,588 | 12/1986 | Fitzpatrick | 403/16 |
| 5,383,793 | 1/1995 | Hsu et al. | 439/327 |
| 5,398,164 | 3/1995 | Goodman et al. | 361/752 |

*Primary Examiner*—Leo P. Picard
*Assistant Examiner*—Y. Whang
*Attorney, Agent, or Firm*—Howard R. Boyle

[57] ABSTRACT

A retaining clip to retain a circuit board insertion/extraction handle on a circuit board. The present invention is a retaining clip which is part of a circuit board inserter and extractor apparatus particularly suited for use with circuit boards utilizing high insertion force connectors requiring in excess of 50 lbs of force. The handle of the inserter/extractor has novel insertion and extraction surfaces which cooperate with corresponding surfaces fabricated as part of a card guide. As the circuit board is inserted into the card guide, the handle is automatically positioned so that the user can press the bottom of the handle to insert the circuit board. The handle and card guide interface is designed to provide a large positive force to extract the circuit board from the card guide until the circuit board is unseated from the associated high insertion force connectors. The clip is constructed of stainless steel and formed into a generally flat "U" shape. This "U" shaped clip fits inside, and is captured by, the handle such that the clip and handle form a single assembly. Circuit board retention tabs, constructed as part of the clip, engage reliefs in the surface of the circuit board thereby preventing the clip and handle from coming off of the circuit board. Also, the circuit board retention tabs serve to transfer the extraction force produced by the handle/card guide interface to the circuit board to force the circuit board out of the card guide. Spring mounted bumps on the retaining clip interact with dimples on the handle to provide a plurality of stable handle positions. Additionally, the present invention is advantageously designed to eliminate the need for fixtures or separate hardware to install the handle onto the circuit board thereby saving assembly line time and money.

10 Claims, 14 Drawing Sheets

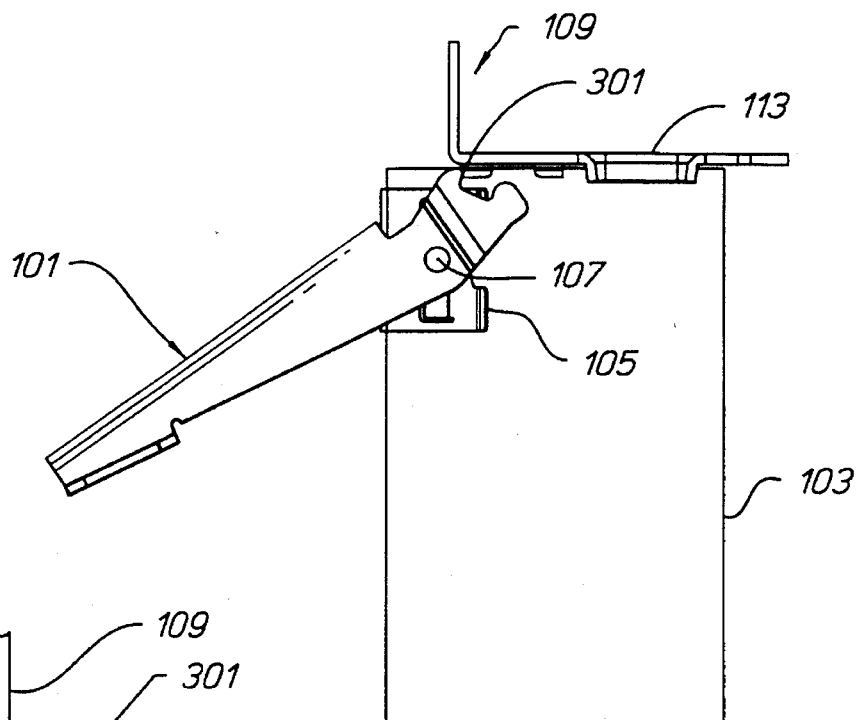
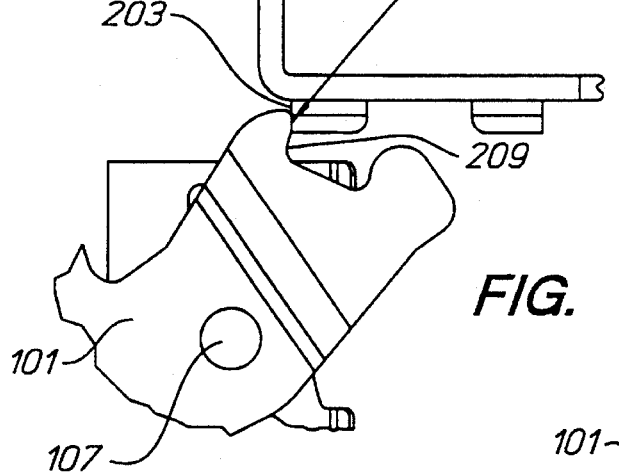
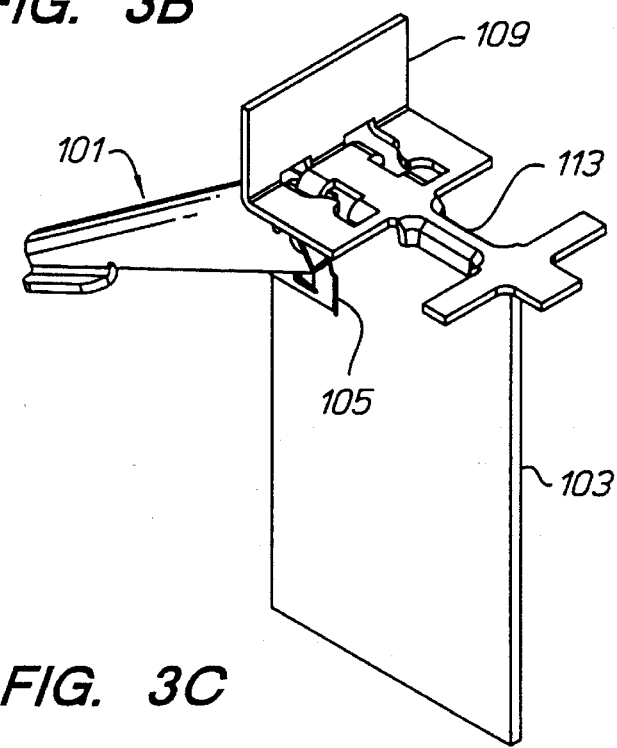
FIG. 3A
FIG. 3B
FIG. 3C

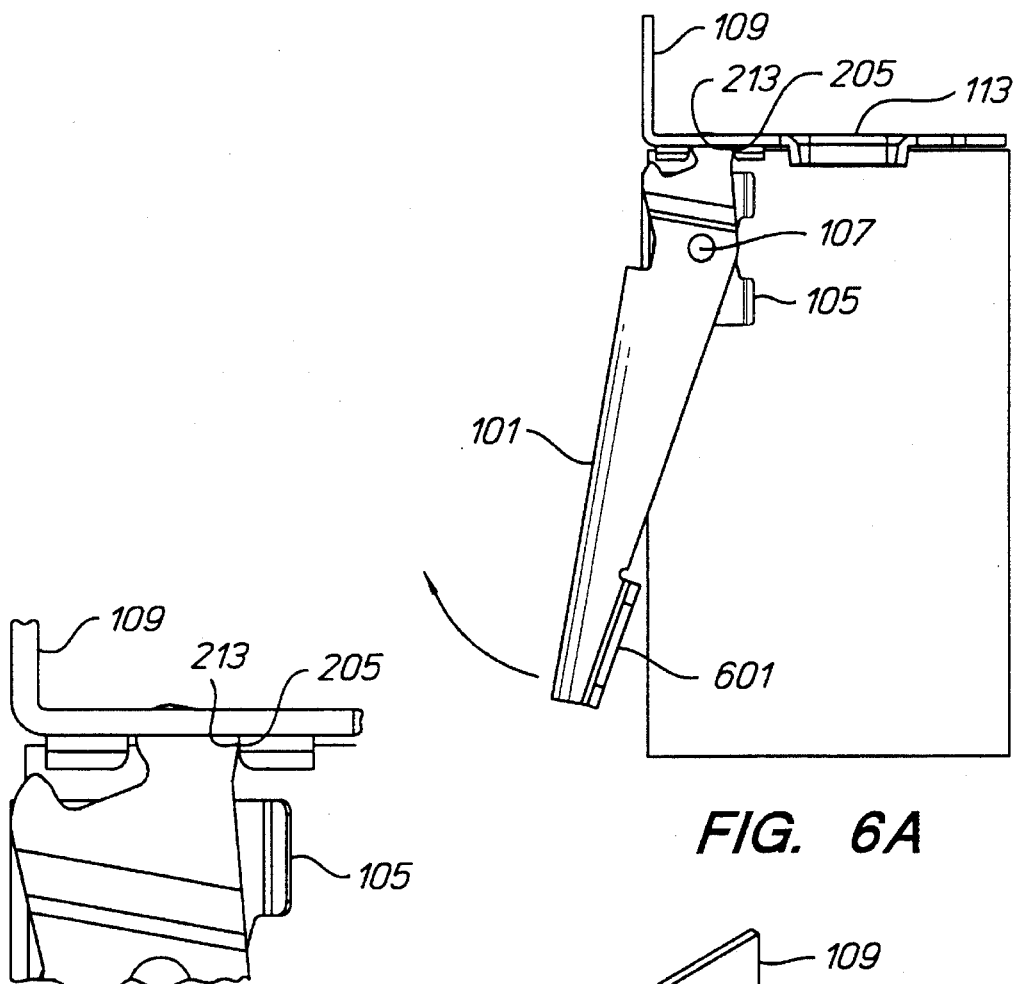
FIG. 6A
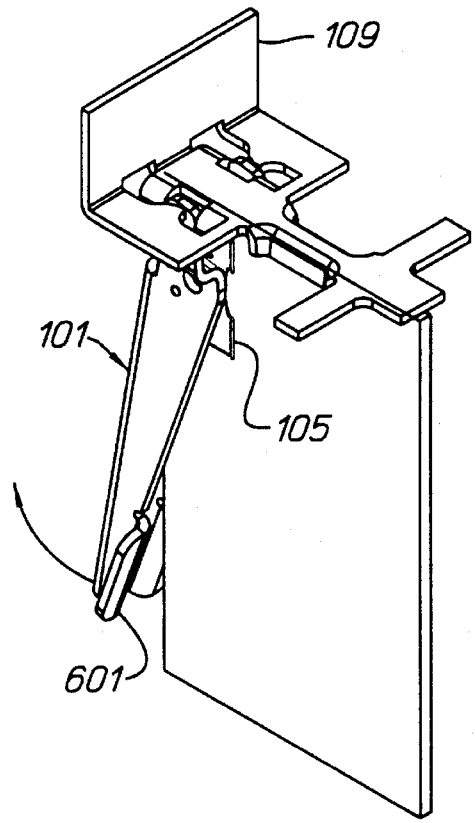
FIG. 6B
FIG. 6C

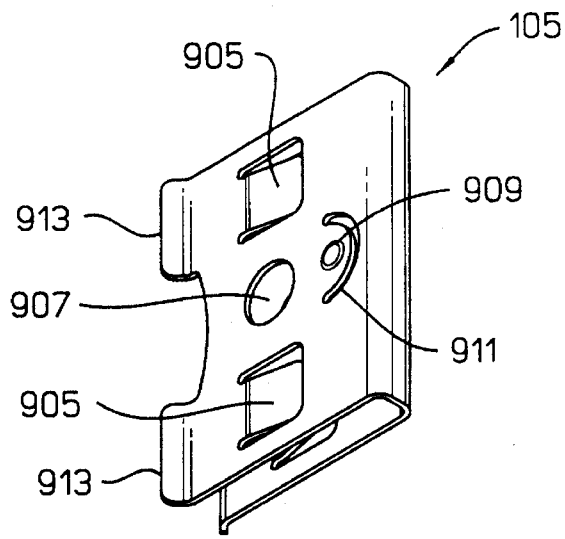
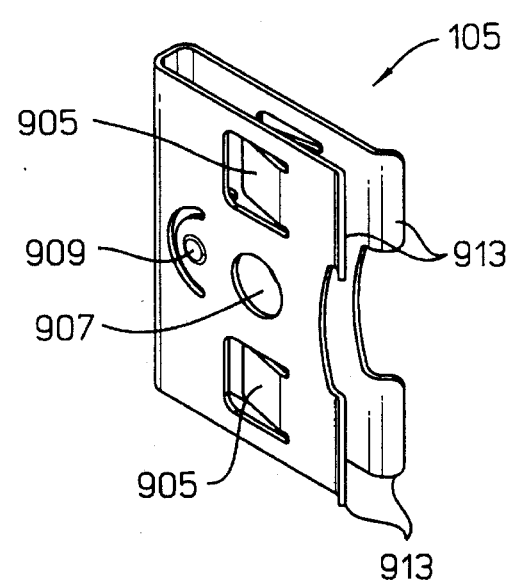
FIG. 9B                FIG. 9A
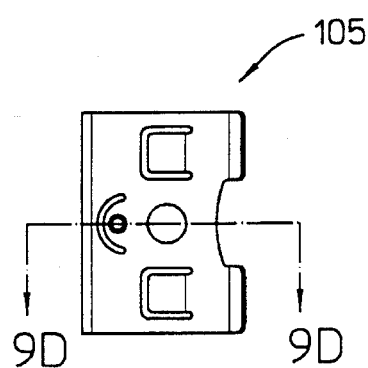
FIG. 9C
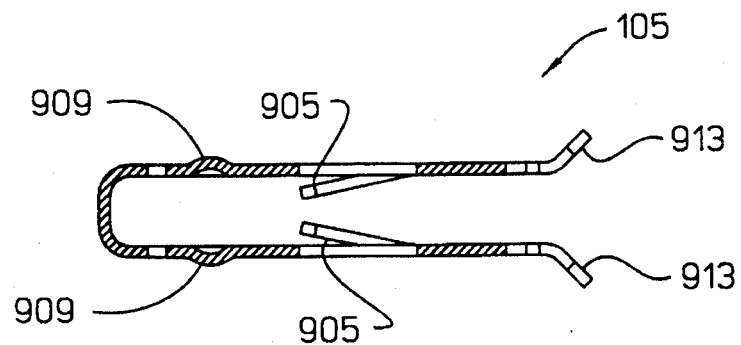
FIG. 9D

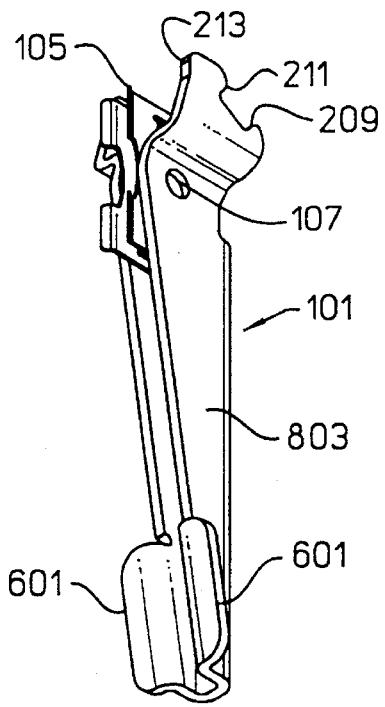
FIG. 10A
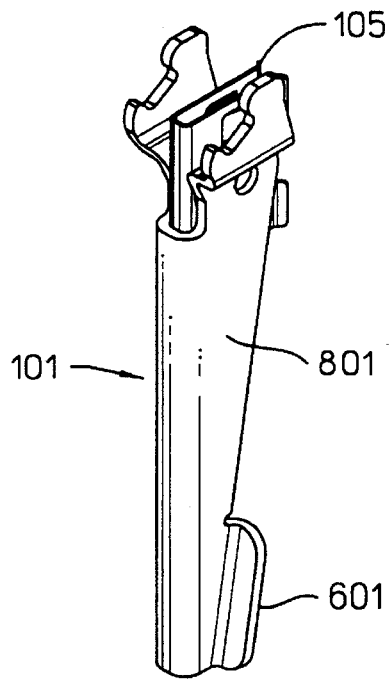
FIG. 10B
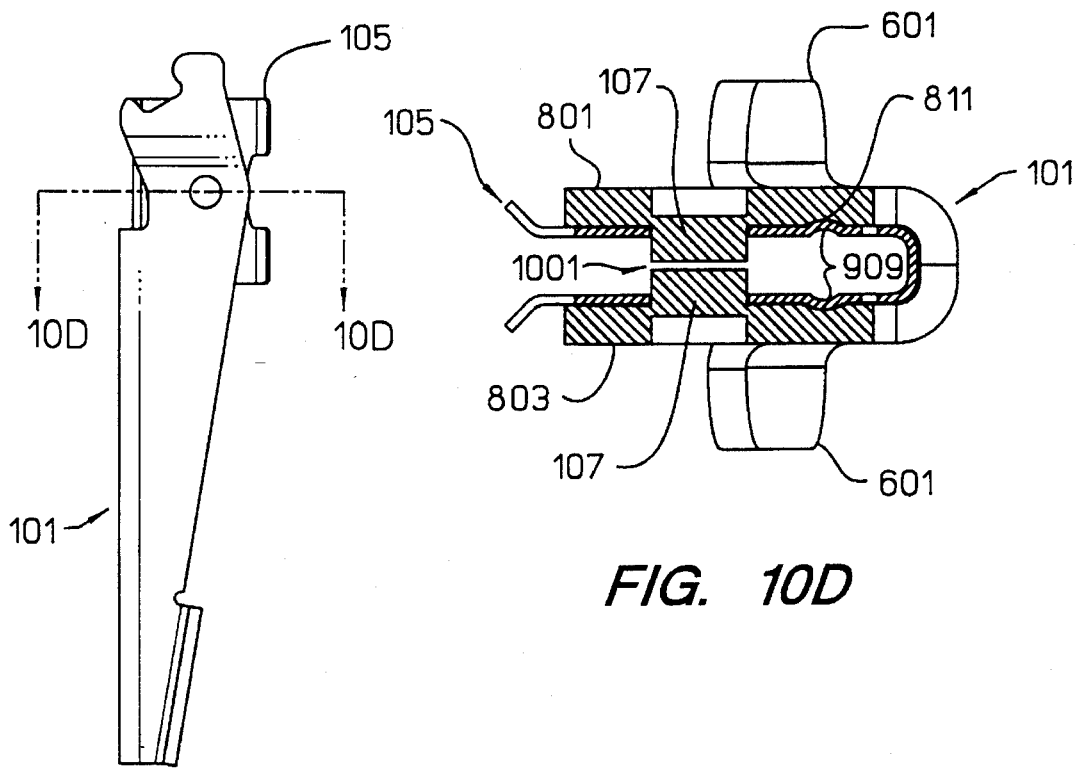
FIG. 10C
FIG. 10D

RETENTION CLIP TO MOUNT A HANDLE TO A CIRCUIT BOARD

FIELD OF THE INVENTION

This invention relates to circuit board/backplane interfaces and particularly to a clip device to attach an insertion/extraction handle to a circuit board.

BACKGROUND OF THE INVENTION

In recent years, printed circuit boards have been used extensively in electrical equipment. For example, computers are routinely constructed of a plurality of printed circuit boards each containing a portion of the electronics required to allow the computer to operate. In computer designs it is common to require several circuit boards to be inserted in a closely-spaced parallel relationship into a card cage having a card guide for every circuit board. A contact arrangement consisting of a card edge or connector on the leading edge of each of the circuit boards engage an electrical connector when the circuit board is fully inserted into the card cage.

The amount of force required to seat a circuit board into a backplane is dependant on the number of contacts and type of electrical connectors used. Typically, the more contacts that must be mated, the more force that must be used to seat the circuit board. Today, computer circuit boards utilize a high number of electrical connections which require high insertion force. Therefore a large amount of force is required to properly seat circuit boards into their backplane connectors. The task of seating the boards is made even more difficult because of the close spacing of circuit boards in the card cage.

With respect to extraction of a circuit board from the backplane, tight board-to-board spacing presents an obstacle to firmly grasping the trailing edge of the circuit board. Also it takes a large amount of force to extract a circuit board utilizing high insertion force connectors. This force is hard to apply in the typically small space available for grasping with a human hand.

It is common to provide a cam lever, pivotally attached to a trailing edge corner of a circuit board to facilitate circuit board removal. The camming action of such a device against the card cage provides a limited amount of extraction, and the device often does not aid in circuit board insertion.

The prior art devices require separate engaging devices to be mounted onto the card guides. These engagement devices complicate and increase the time and expense required for the card cage to be assembled.

Prior art extraction systems also require tools and fixtures to attach them onto the circuit boards. Typically, screws or rivets are used to attach the cam lever to the circuit board. To allow the lever to pivot as required, the screw or rivet holding the lever to the circuit board can not be too tight. However, if the lever is not restrained sufficiently, then the lever will not properly engage the card guide and will not extract the circuit board properly—if at all. Therefore special tools and fixtures are used to assure the proper retention of the lever to the circuit board which increases the time and expense required to assemble a complete circuit board assembly. Additionally, the lever attachment step typically requires a separate "station" on the manufacturing line. This station must be designed into the assembly line and the power for the tools has to be provided. Each additional station adds to the space required in assembly and increases the fixed and variable overhead costs which must be recovered by the product sales price.

What is needed in the industry is a circuit card inserter and extractor device which can be assembled onto a circuit board quickly and without tools and can supply the high insertion and extraction forces required by high insertion force connectors used today.

SUMMARY OF THE INVENTION

The present invention is a retaining clip uniquely constructed to retain a rigid circuit board insertion/extraction handle onto a circuit board. This clip serves to transfer the large forces generated by the handle during the insertion or extraction process to the circuit board so that the circuit board is forced to move relative to a card guide.

The retaining clip is constructed to fit inside, and be retained by, the handle to form a handle/clip assembly. This assembly is then slid over the edge of a circuit board having both a clip interface and a pivot relief. Features on the retaining clip engage inside these reliefs and securely retain the handle/clip assembly on the circuit board. Once installed on the circuit board, the retaining clip serves to transfer forces from the handle to the circuit board when the circuit board is being inserted or extracted from the card guide. By utilizing this novel attachment method, no tools or fixtures are required to assemble the handle/clip assembly to the circuit board as required by prior art devices.

The clip is constructed of full hard stainless steel and formed into a generally rectangular flat "U" shape with each side of the two sides of the "U" shape being symmetric. Each side of the clip includes two circuit board retention tabs. The tabes are deflected outward as the clip is slid over the circuit board and then snap inward as they pass over reliefs formed in the circuit board. Once the tabs snap inward, they prevent the clip from sliding off the circuit board. In addition, during the circuit board extraction process, the tabs transfer the force generated by the handle to the circuit board and thereby cause the circuit board to withdraw out of an associated card guide.

Two bumps, one on each side of the clip, cooperate with dimples on the insertion/extraction handle to hold the handle in either an open or closed position. Spring tension between the bumps and the inner surfaces of the handle provides a user with a smooth operational feel when the user moves the handle. Additionally, both sides of the retaining clip have leading edges which are angled away from the center of the clip to form a circuit board guide which aids in installing the clip over the circuit board.

BRIEF DESCRIPTION OF THE DRAWINGS

FIGS. 3A–3C illustrate the initial engagement between the insertion/extraction handle and the HIF.

FIGS. 6A–6C illustrate the insertion/extraction handle initially engaging surfaces on the HIF to eject the circuit board.

FIGS. 9A–9D are detailed views of the retention clip and the features on the retention clip.

FIGS. 10A–10D illustrate the insertion/extraction handle mated with the retaining clip.

DETAILED DESCRIPTION OF THE INVENTION

Operation of the Invention

The present invention is part of a circuit board insertion/extraction system that is constructed in three pieces. An extractor handle manufactured of ¼ hard stainless steel, a retaining clip made of full-hard stainless steel and a handle interface feature (HIF) incorporated in the card cage. The handle provides an approximately 4.5 to 1 mechanical advantage for inserting and extracting boards utilizing high insertion force connectors. As the handle is made of metal, it does not flex and provides enough leverage to insert or extract circuit boards requiring 60 lbs of force or more.

The retaining clip serves three main purposes. First it attaches the handle to the circuit board. Second, it transfers the forces from the handle to the board when the board is being extracted. The clips third function is to fix the handle in the open or closed position and to provide tactile feedback to the user. This tactile feedback is accomplished via 2 bumps on the clip that fall into corresponding dimples on the handle when the handle is fully opened or fully closed. This feature also frees the user from having to hold the handle while the board is being inserted into the card guide and resists the tendency of the card to back out of the card guide once positioned.

Except when the handle is fully opened or closed, the bumps on the clip are deflected and provide friction between the handle and clip resulting in a nice feel and stability of the handle. When the bumps fall into the dimples on the handle, the user feels the engagement and thereby knows the handle is either in the closed or open position.

The main function of providing the required insertion or extraction leverage is accomplished by the interface between the profile of the handle and the interface features on the card cage. While upper and lower handle interface features and upper and lower extractors are normally utilized, the following description will refer only to the upper HIF and extractor operation for simplicity as the operation of the lower assemblies is identical to what is described.

In the following description of the invention, numbers will be used to refer to specific features or areas. The first numeral in a three digit number and the first two numerals in a four digit number refer to the first drawing that reference number is used in.

Figure 1A:
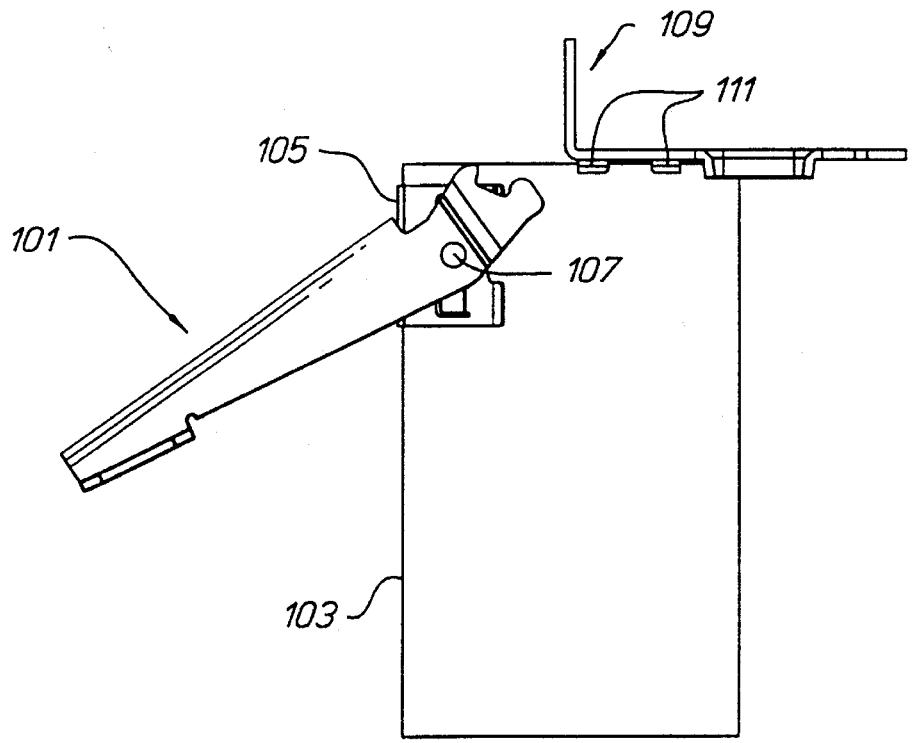
FIGS. 1A and 1B are side and isometric views of the invention mounted on a circuit board and positioned to engage a handle interface feature (HIF).
Figure 1B:
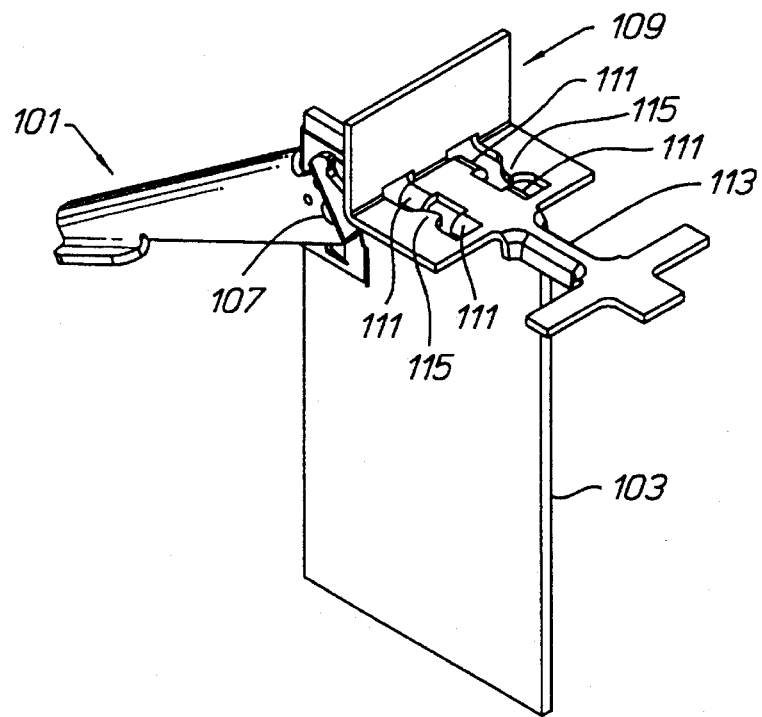

Referring now to FIGS. 1A and 1B, a handle 101 is attached to a circuit board 103 by a retaining clip 105. The handle 101 is free to rotate on a handle pivot 107 (only right side pivot shown). A card guide 113 provides lateral guidance for the circuit board 103 and the first one is integrated into the HIF 109 which includes engagement features 111. The lateral guidance is provided by the restriction feature 113 as is well know in the art. Also included in the HIF are handle engagement centering features 115.

Figure 2:
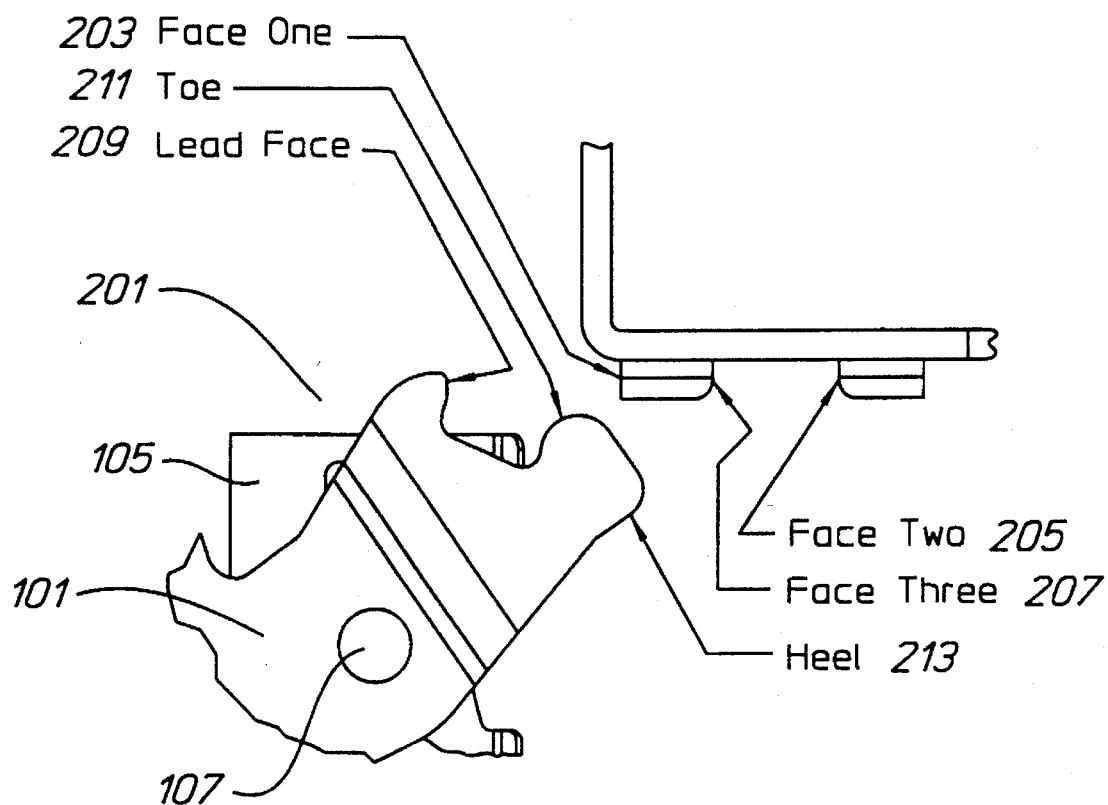
FIG. 2 is a detailed illustration of the engagement features of the insertion/extraction handle and the HIF.

FIG. 2 illustrates the engagement features 111 of the HIF and the engagement end of the handle 201. The engagement features 111 of the HIF include three face surfaces, face one 203, face two 205 and face three 207 on each side (right side shown only). The handle also includes three engagement surfaces on each side. These handle surfaces are a lead face 209, a toe face 211 and a heal face 213.

To insert a circuit board into the card cage, the handle is placed in the fully open position where it is held by the bum/dimple action (not illustrated) in the handle and clip. The board is placed in the card guide 113 and pushed into the chassis in typical fashion. As the lead face 209 of the handle 101 makes contact 301 with face one 203 of the HIF 109, the handle is forced to start to pivot and close. This interaction is best illustrated by FIGS. 3A, 3B and 3C where FIG. 3A is a side view, FIG. 3C is a perspective view and FIG. 3C is a detailed view of the interacting engagement faces of the handle and card guide.

Figure 4A:
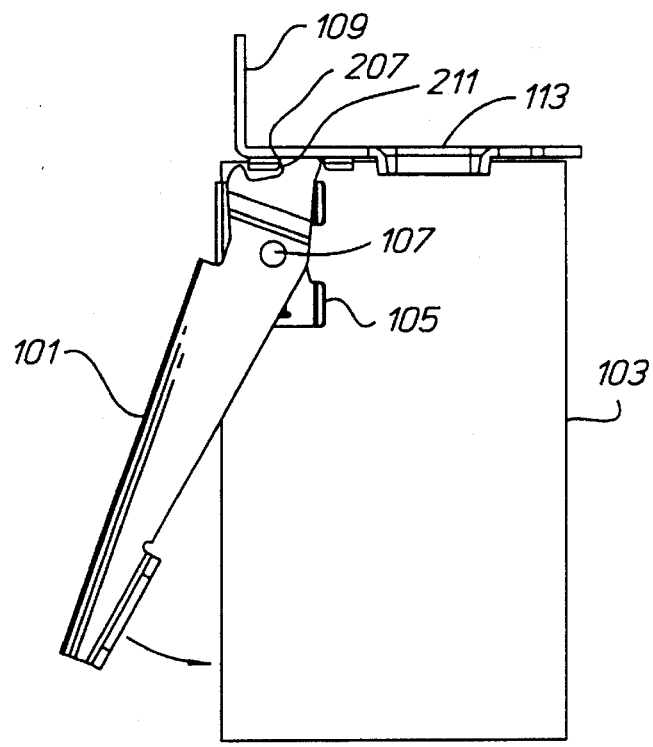
FIGS. 4A–4C illustrate the insertion/extraction handle positioned to leverage the circuit board into the backplane connectors.
Figure 4B:
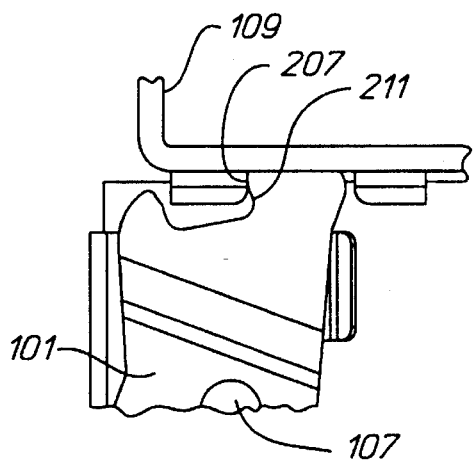
Figure 4C:
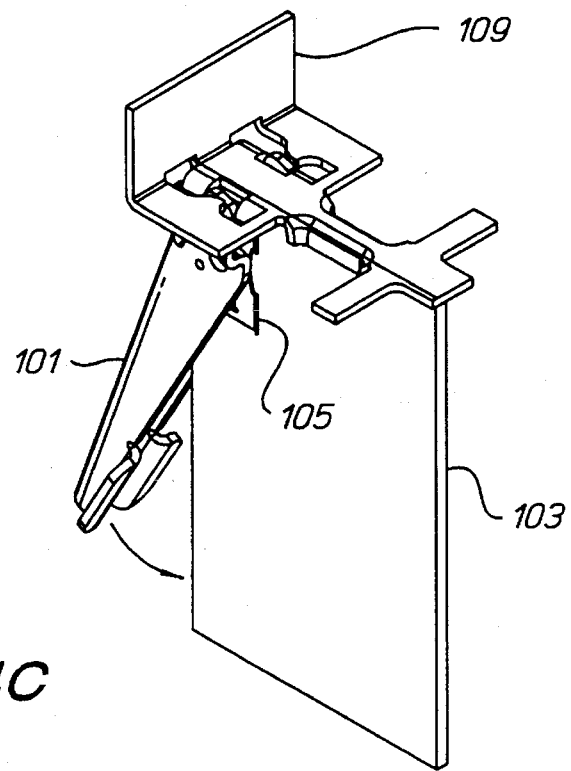

Now referring to FIGS. 4A–4C, the board continues into the card cage until connector resistance requires the use of the handle. As the board moves into the card cage, the handle continues to pivot toward the closed position and is properly positioned to insert the board at any point along this path. As the handle continues to close, the point of contact between the handle and the HIF moves from edges 203 and 209 to the toe 211 of the handle and face three 207 of the HIF. The handle centering features 115 on the HIF serves to keep the engagement features of the handle and the card guide aligned as required.

Figure 5A:
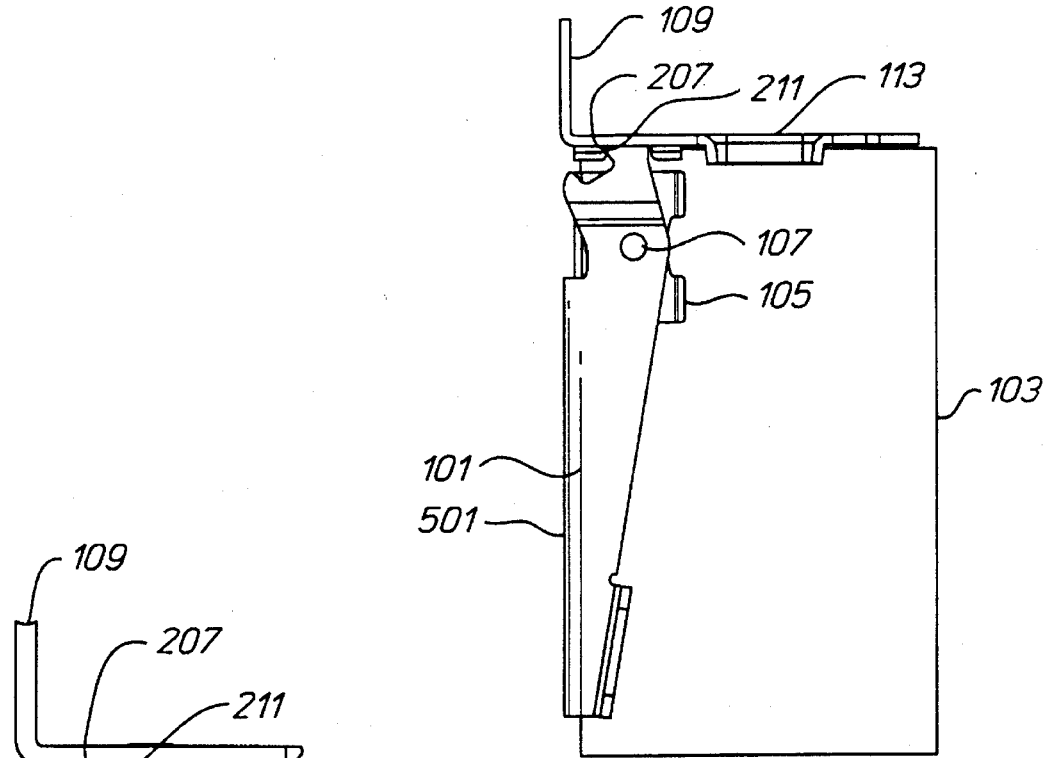
FIGS. 5A–5C illustrate the insertion/extraction handle in the closed position and the circuit board fully seated into the card cage.
Figure 5B:
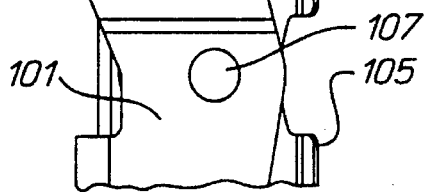
Figure 5C:
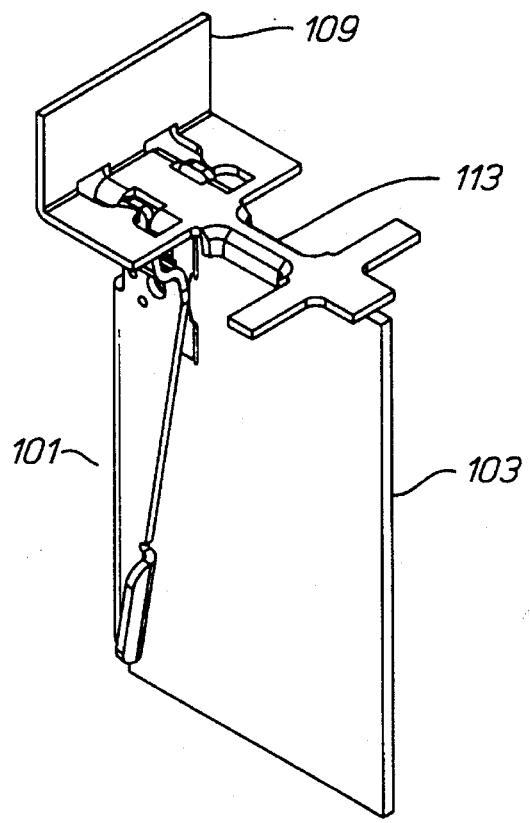

As best illustrated in FIGS. 5A–5C, when the resistance of the connectors requires the use of the handle, the user pushes on the end 501 of the handle 101 which in turn forces the toe 211 of the handle against face three 207 of the card guide. The resultant force is transferred to the board by the handle forcing the pivot 107 against the board 103 thereby causing the board to seat inside the connectors completing the insertion process. The handles are held in the closed position by the bump/dimple action (not shown).

A significant feature of this circuit board insertion/extraction system is that a card shorter than the card cage can be utilized as the handle to HIF engagement takes place outside of the card guide area. That is, the handle insertion and extraction features straddle the card guide area 113 and can remain open until they meet the corresponding surfaces of the HIF. Therefore, the HIF can be recessed in the card cage, with card guides such as 113 preceding it, allowing a short card to be used in a computer chassis utilizing both long and short cards. This allows the use of a standard card in systems having different card cage depths.

As illustrated in FIGS. 6A–6C, to extract a board from a card guide the handle is pulled open by the user thereby forcing the board out of the card cage. By pulling on the extraction thumb tab 601, the handle 101 is forced away from the board 103. As the handle is opened, the heel 213 of the handle is forced against face two 205 of the HIF. The resultant force is transferred from the handle 101 through the clip 105 and to the board. This action forces the board to move out of the card cage.

Figure 7A:
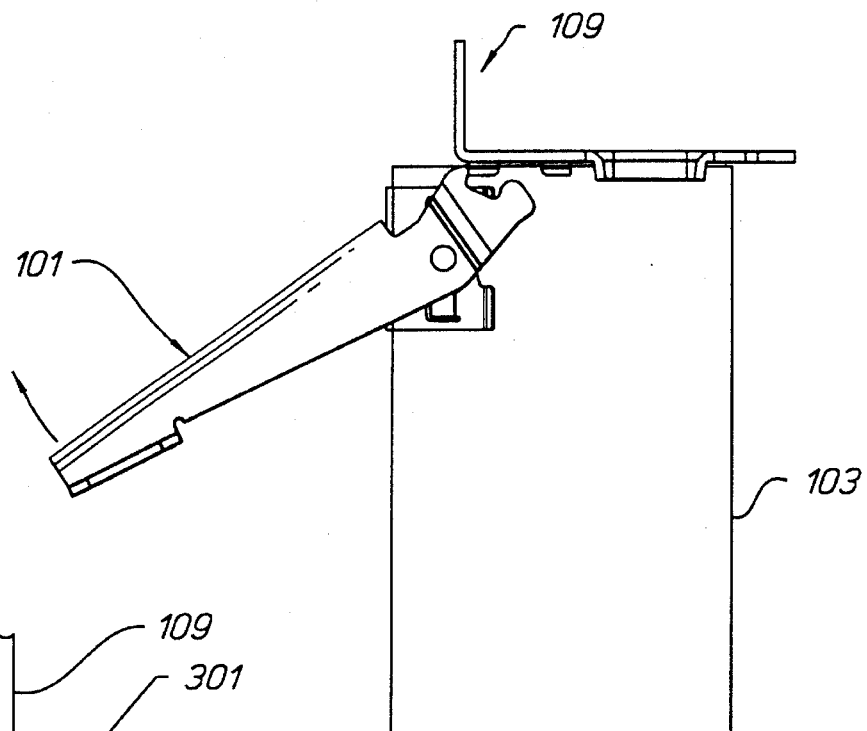
FIGS. 7A–7C illustrate the insertion/extraction handle in the final engagement position relative to the HIF in the circuit board ejection sequence.
Figure 7B:
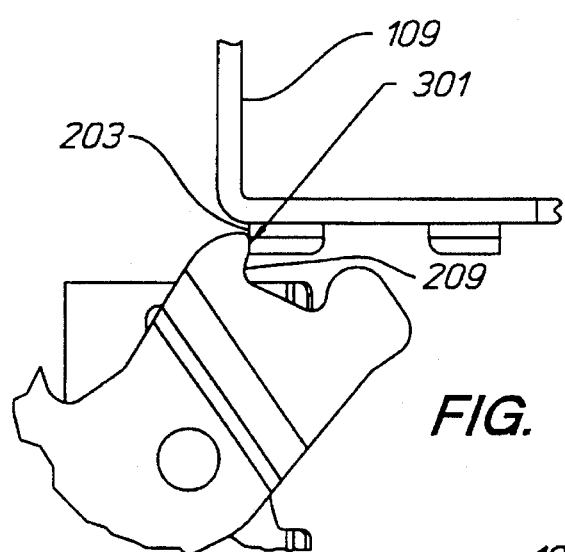
Figure 7C:
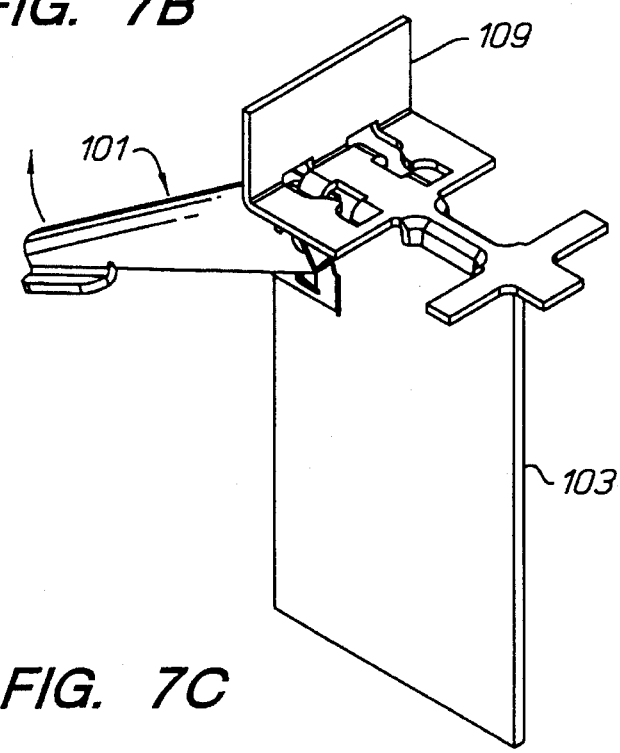

Referring now to FIGS. 7A–7C, as the handle 101 continues to open, the point of interface between the handle and card guide moves to the lead face 209 of the handle and face one 203 of the HIF. The resultant force continues to be transferred to the board as before forcing the board out of the card cage. In practice, once the board is clear of the electrical connectors, minimal force is required and the board is pulled clear of the card guide by pulling on the board by hand.

Construction of the Invention

Figure 8B:
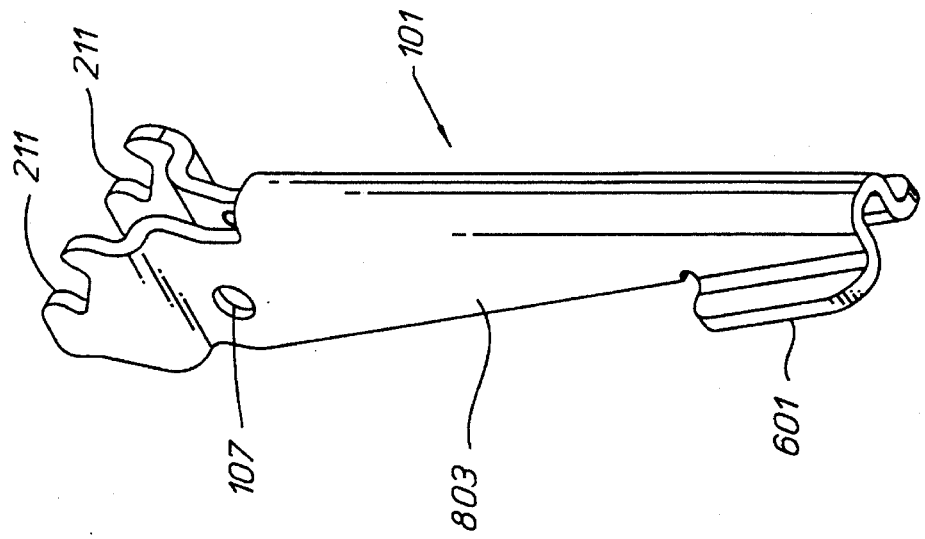
FIGS. 8A–8F are detailed views of the insertion/extraction handle.
Figure 8A:
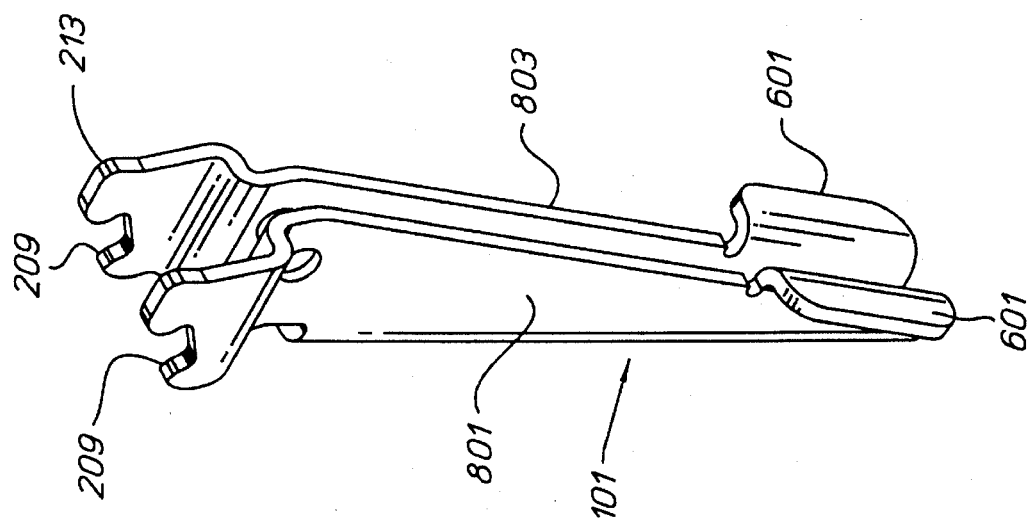

FIGS. 8A and 8B are front and rear isometric views of the handle 101. As illustrated, the handle is constructed of one piece of stainless steel bent to form two sides 801 and 803. Each side includes a thumb tab 601, a handle pivot 107, a lead face 209, a toe 211 and a heel 213. A preferred construction method for this handle is to punch and form the stainless steel in a progressive die out of 0.048" sheet stock. The handle is manufactured with the channel not fully bent into the final position to allow the retaining clip to be inserted into the handle channel. Once the clip is inserted into the handle, the channel is then closed to the final position thereby capturing the clip.

Figure 8C:
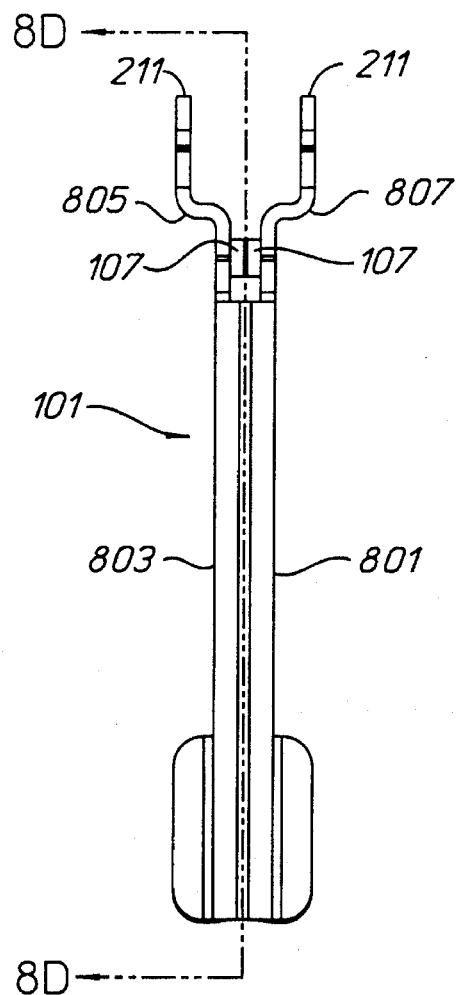

FIG. 8C is a rear view of the handle 101. The handle pivots 107 are shown in profile. The handle pivots 107 are designed as a short cylindrical columns that are highly stiff. Each side 801 and 803 are bent outwardly 805 and 807 at the top of the handle. These bends are such that the HIF are sufficiently far apart such that they clear the card guide 113. In this manner, the handle will pass outside of the card guide until it engages the appropriate engagement surfaces on the HIF.

Figure 8D:
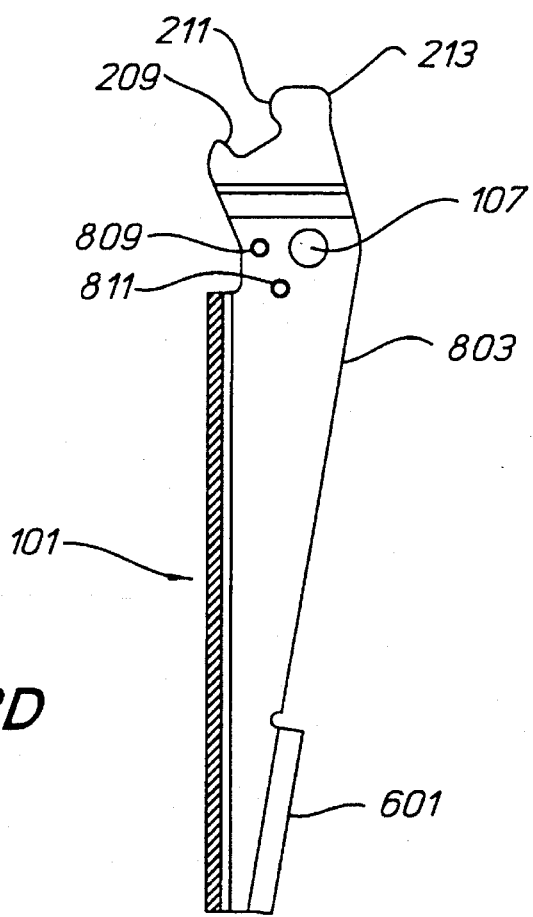

FIG. 8D is a sectional view taken along the lines 8D of FIG. 8C. A handle open dimple 811 and a handle closed dimple 809 are illustrated. These dimples cooperate with bumps on the retaining clip to hold the handle in the open or closed position. Each side 801 and 803 has a pair of handle open and handle closed dimples.

Figure 8E:
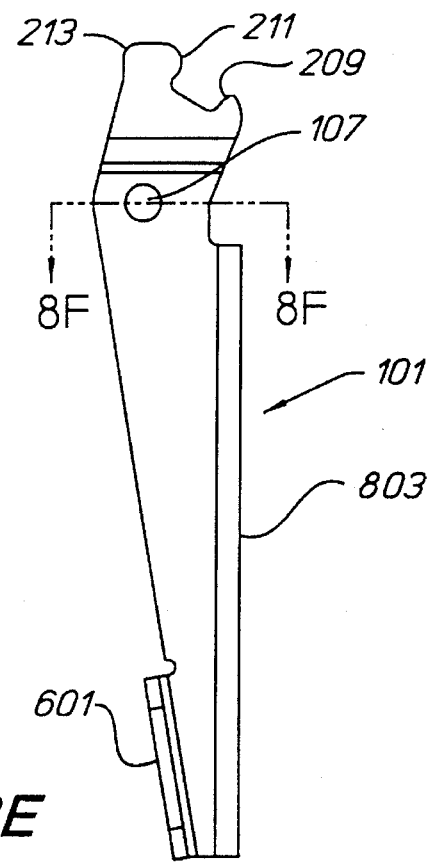
Figure 8F:
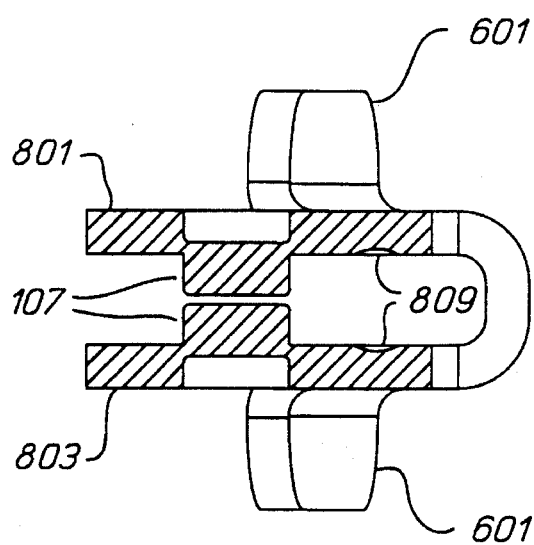

FIG. 8E is a side view and FIG. 8F is a sectional view of the handle 101 taken along lines 8F of FIG. 8E. A best illustrated in FIG. 8F, the handle pivots 107 are formed from material extruded inward by the fabrication tool. Also the two handle closed dimples 809, one in side 801 and one in side 803, are illustrated. While the handle can be of any convenient length, it is advantageously at least 2.5" long to provide sufficient leverage to insert and extract a circuit board utilizing high insertion force connectors.

FIGS. 9A and 9B are front and rear isometric views of the retaining clip 105. The retaining clip is formed from 0.012" stainless steel flat stock and fabricated on a 4-slide machine to form two symmetric sides 901 and 903. Each side 901 and 903 has two circuit board retention tabs 905, a handle pivot clearance hole 907, a bump 909, a bump spring relief area 911 and two circuit board guides 913.

As illustrated, each bump 909 is surrounded by a half semicircle spring relief area 911. This spring relief area allows the bump to flex inward as is required when the handle 101 is being moved between the handle open and the handle closed dimples. To assist in sliding the retaining clip 105 over a circuit board, the circuit board guides 913 are provided. These guides help center the clip relative to the leading edge of a circuit board making sliding the retaining clip onto the circuit board easy.

FIG. 9C is a side view and FIG. 9D is a sectional view of the retaining clip 105 taken along lines 9D of FIG. 9C. As is best illustrated in FIG. 9D, the circuit board retention tabs 905 are short stiff springs which flex inward to allow the clip to be inserted onto a circuit board. The clips 905 then engage reliefs in the circuit board thereby preventing the clips from coming off the circuit board. In addition, the clips 905 also transfer the extraction forces from the handle to the circuit board.

FIGS. 10A and 10B are front and rear isometric views of the handle 101 with the retaining clip 105 installed within the handle. The clip 105 is installed inside the handle by inserting the clip inside the handle such that the handle pivots 107 fit inside the handle pivot clearance holes 907. The clip is inserted inside the handle before the two sides 801 and 803 of the handle are bent together. Once the two handle sides 801 and 803 are bent into their final positions, the clearance between the ends of the two handle pivots 107 is such that the retaining clip can no longer be separated from the handle 101. To prevent galling of the metal handle by the full hard clip bumps, a suitable lubricant is used between the handle and retaining clip when they are assembled.

FIG. 10C is a side view and FIG. 10D is a sectional view of the handle and retaining clip assemble taken along lines 10D of FIG. 10C. In FIG. 10D the retaining clip 105 is illustrated retained inside the handle by the handle pivots 107. The gap 1001 between the ends of the handle pivots is sufficiently narrow to prevent the retaining clip 105 from separating from the handle 101. Each of the bumps 909 of the retaining clip 105 is illustrated seated inside the handle closed dimples 809 inside the sides 801 and 803 of the handle 101.

Figure 11B:
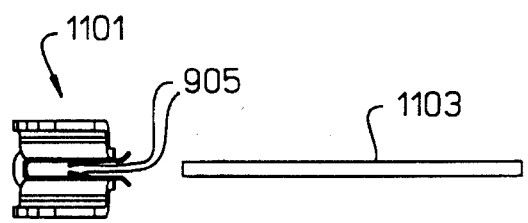
FIGS. 11A–11D illustrate the handle/clip assembly of FIGS. 10A–10D being attached to a circuit board.
Figure 11D:
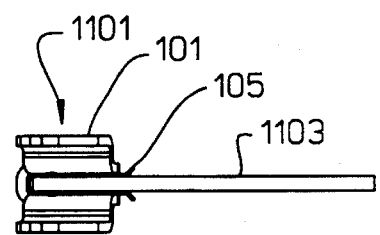
Figure 11A:
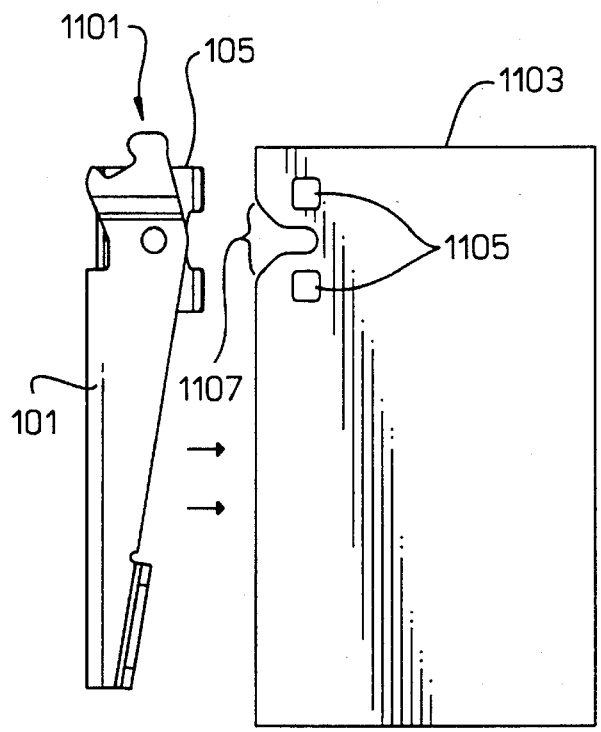

FIGS. 11A is a side view and FIG. 1B is a top view which illustrate the handle/clip assembly 1101 being inserted onto a circuit board 1103. The circuit board has reliefs 1105 formed in the circuit board and a pivot relief area 1107. Each of the circuit board reliefs 1105 are sized to engage the circuit board retention clips 905 which are part of the retention clip 105. As the handle/clip assembly 1101 is slid over the circuit board 1103, the circuit board retention clips 905 deflect until they are over the reliefs 1105. At that time the clips 905 spring inwardly thereby preventing the handle/clip assembly 101 from separating from the circuit board 1103. The pivot relief area 1107 guides the pivots 107 of the handle so that the handle/clip assembly is correctly positioned on the circuit board to allow the circuit board retention clips 905 to engage the circuit board reliefs 1105. They are also tapered for ease of assembly.

Figure 11C:
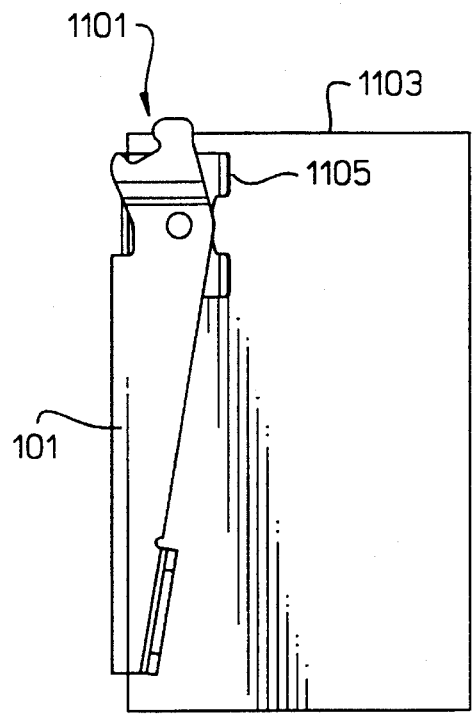

FIG. 11C is a side view and FIG. 11D is a top view of the handle 101 and clip 105 properly inserted onto the circuit board 1103. Once the handle/clip assembly 1101 is inserted onto the circuit board, the handle and clip assembly is fixed onto the board in a physically robust manner thereby insuring the insertion and extraction system will function reliably. Also, this novel handle attachment apparatus eliminates the screws, rivets and pins utilized in prior art designs which required a press or fixture on the manufacturing lines and the attendant attachment time by manufacturing line personnel.

Figure 12B:
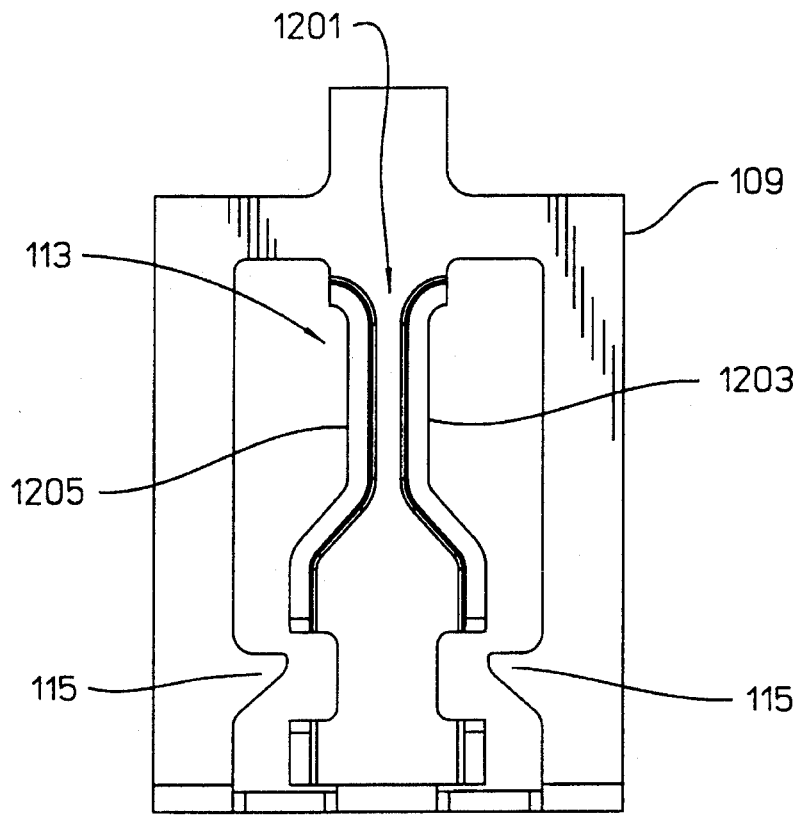
FIGS. 12A–12B are detailed views of a section of a HIF incorporated into a card guide.
Figure 12A:
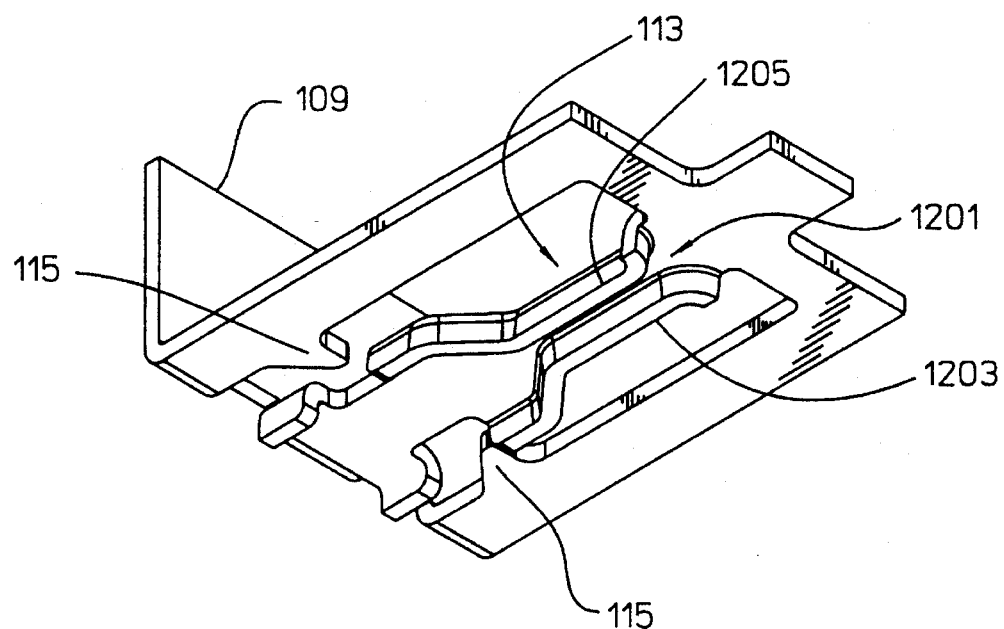

FIG. 12A is a bottom isometric view and FIG. 12B is a bottom view of the HIF 109 shown here incorporated with the first card guide. This HIF is constructed of card cage metal and formed by a punch and die in the card cage manufacturing process. A card guide 113 is provided to guide a circuit board in a channel 1201 formed by two side walls 1203 and 1205.

As previously mentioned, if a short circuit board is to be mixed in a card cage with long circuit board, the HIF can be positioned after the card guide(s) 113. This allows the short circuit card to be guided into position by the card guide 113 and the HIF to be positioned as required (recessed inside the card cage) to insert and extract the short board from the electrical connectors inside the card cage.

Other embodiments of the invention will be apparent to the skilled in the art from a consideration of this specification or practice of the invention disclosed herein. It is intended that the specification and examples be considered as exemplary only, with the true scope and spirit of the invention being indicated by the following claims.

I claim:

1. A retaining clip apparatus, for retaining an insertion/extraction handle constructed with a channel in the middle thereof and two opposing pivot projections internal to the channel to a circuit board having a plurality of reliefs in the surface thereof, comprising:

a "U" shaped generally flat retaining clip having a first and a second side;

each side of the retention clip includes a handle pivot aperture operative to receive a handle pivot projection such that when the retaining clip is inserted into the channel of the handle, the handle pivot projections cooperate with the handle pivot apertures to thereby enable the handle to pivot relative to the clip; and a first circuit board retention tab associated with the first side and a second circuit board retention tab associated with the second side of the retaining clip where both circuit board retention tabs project inwardly from the associated sides toward the middle of the "U" shape such that when the clip is slid over the surface of the circuit board, the retention tabs cooperate with the reliefs in the surface of the circuit board to thereby retain the clip and the handle on the circuit board.

2. An apparatus as in claim 1 wherein:

each of the first and second sides of the retaining clip include leading edges and the leading edges are bent outwardly away from the center of the "U" shape to form a circuit board guide.

3. An apparatus as in claim 1 wherein:

each of the first and second sides of the retaining clip include "bumps" and the bumps cooperate with a plurality of "dimples" formed on the handle such that the handle is prevented from freely rotating when the handle is positioned such that part of the "bumps" fit into the "dimples".

4. An apparatus as in claim 3 wherein:

the bumps are spring biased against, and contact, the handle such that rotation of the handle relative to the retaining clip is fictionally resisted by the friction of the bump to handle contact.

5. An apparatus as in claim 1 wherein:

the retaining clip is constructed from stainless steel.

6. A retaining clip apparatus, for retaining an insertion/extraction handle constructed with a channel in the middle thereof and two opposing pivot projections internal to the channel to a circuit board having a plurality of reliefs in the surface thereof, comprising:

a "U" shaped generally flat retaining clip having a first and a second side;

each side of the retention clip includes a handle pivot aperture operative to receive a handle pivot projection such that when the retaining clip is inserted into the channel of the handle, the handle pivot projections cooperate with the handle pivot apertures to thereby enable the handle to pivot relative to the clip; and a plurality of circuit board retention tabs associated with the first side and a plurality of circuit board retention tabs associated with the second side of the retaining clip where the circuit board retention tabs project inwardly from the associated sides toward the middle of the "U" shape such that when the clip is slid over the surface of the circuit board, the retention tabs cooperate with the reliefs in the surface of the circuit board to thereby retain the clip and the handle on the circuit board.

7. An apparatus as in claim 6 wherein:

each of the first and second sides of the retaining clip include leading edges and the leading edges are bent outwardly away from the center of the "U" shape to form a circuit board guide.

8. An apparatus as in claim 6 wherein:

each of the first and second sides of the retaining clip include "bumps" and the bumps cooperate with a plurality of "dimples" formed on the handle such that the handle is prevented from freely rotating when the handle is positioned such that part of the "bumps" fit into the "dimples".

9. An apparatus as in claim 8 wherein:

the bumps are spring biased against, and contact, the handle such that rotation of the handle relative to the retaining clip is frictionally resisted by the friction of the bump to handle contact.

10. An apparatus as in claim 6 wherein:

the retaining clip is constructed of stainless steel.

* * * * *